(12) United States Patent
Kang et al.

(10) Patent No.: US 7,218,006 B2
(45) Date of Patent: May 15, 2007

(54) MULTI-CHIP STACK PACKAGE

(75) Inventors: Jung-Kun Kang, Kaoshiung (TW); Chin-Hsien Lin, Kaoshiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 0 days.

(21) Appl. No.: 11/258,137

(22) Filed: Oct. 26, 2005

(65) Prior Publication Data

US 2006/0091560 A1 May 4, 2006

(30) Foreign Application Priority Data

Oct. 28, 2004 (TW) .............................. 93217198 U

(51) Int. Cl.
*H01L 23/48* (2006.01)
*H01L 23/52* (2006.01)
*H01L 29/40* (2006.01)

(52) U.S. Cl. ................... 257/777; 257/686; 257/781; 257/784

(58) Field of Classification Search ............... 257/777, 257/778, 723, 784, 686, 780–781
See application file for complete search history.

(56) References Cited

U.S. PATENT DOCUMENTS 6,812,575 B2 * 11/2004 Furusawa ................... 257/774
6,984,889 B2 * 1/2006 Kimura ...................... 257/723
7,084,487 B1 * 8/2006 Conn ......................... 257/660
2003/0153122 A1 8/2003 Brooks

* cited by examiner

*Primary Examiner*—Zandra V. Smith
*Assistant Examiner*—Thanh Y. Tran
(74) *Attorney, Agent, or Firm*—Volentine & Whitt, P.L.L.C.

(57) ABSTRACT

A multi-chip stack package mainly includes a substrate, a first chip, a redistribution structure and at least one second chip. The first chip is disposed on the substrate with an active surface facing upwards. The redistribution structure includes a plurality of first intermediate pads, a plurality of second intermediate pads and a plurality of external pads. The first intermediate pads, the second intermediate pads, and the external pads are formed on the first active surface of the first chip, wherein the first intermediate pads and the second intermediate pads are electrically connected with each other. The second chip is disposed on the redistribution structure, and electrically connected to the first intermediate pads. The second intermediate pads are electrically connected to the substrate through a plurality of bonding wires, so that the second chip and the substrate are electrically conducted, and the connection length of the bonding wires is reduced.

11 Claims, 3 Drawing Sheets

MULTI-CHIP STACK PACKAGE

BACKGROUND OF THE INVENTION

1. Field of the Invention

The present invention relates to a multi-chip stack package, and more particularly to a multi-chip stack package that can reduce the length of bonding wires.

2. Description of the Related Art

To achieve the small size of the multi-chip package structure, a plurality of chips are stacked on a substrate, and electrically connected to the substrate by wire bonding or flip-chip bonding. Referring to FIG. 1, a conventional multi-chip stack package 100 formed by wire bonding comprises a substrate 110, a first chip 120, a second chip 130, and a plurality of bonding wires 140, 150. The first chip 120 is disposed on the substrate 110, and electrically connected to the substrate 110 through the bonding wires 140. The second chip 130 is stacked on the first chip 120, with a dimension smaller than that of the first chip 120, and electrically connected to the substrate 110 through the bonding wires 150. Since the second chip 130 with a smaller dimension is stacked on the first chip 120, the long bonding wires 150 are required to connect the second chip 130 to the substrate 110. Therefore, when molding, the bonding wires 150 are easily pushed by the mold flow, thus resulting in a short circuit.

Referring to FIG. 2, a multi-chip stack package structure 200 disclosed in the US Pub. No. 2003/0153122 comprises a package substrate 210, a first chip 220, an interposer 230, a second chip 240, and a plurality of bonding wires 250, 260, 270. The package substrate 210 comprises a plurality of bonding pads 211. The first chip 220 comprises a plurality of bonding pads 221, 222 formed on an active surface thereof, and is attached to the package substrate 210 by an adhesive 223. A surface 231 of the interposer 230 is formed with a plurality of bonding pads 232, 233 and a plurality of wires 234 connecting the bonding pads 232 and the bonding pads 233. The interposer 230 is stacked and adhered to the first chip 220 by an adhesive 235, and exposes the bonding pads 221, 222 of the first chip 220. The second chip 240 comprises a plurality of bonding pads 241, and stacked and adhered to the interposer 230 by an adhesive 242. The second chip 240 at least exposes the bonding pads 232, 233 of the interposer 230. The bonding wires 250 are used to connect the bonding pads 241 of the second chip 240 and the bonding pads 232 of the interposer 230. The bonding wires 260 are used to connect the bonding pads 233 of the interposer 230 and the bonding pads 221 of the first chip 220. The bonding wires 270 are used to connect the bonding pads 222 of the first chip 220 and the bonding pads 211 of the substrate 210. Since the wires 234 are used to connect the bonding pads 232 and the bonding pads 233, the second chip 240 can electrically conduct with the substrate 210 through the bonding wires 250, the interposer 230, the bonding wires 260, and the bonding wires 270. However, since the interposer 230 is disposed between the first chip 220 and the second chip 240, the thickness of the stacked chip package is increased.

Consequently, there is an existing need for a multi-chip stack package to solve the above-mentioned problems.

SUMMARY OF THE INVENTION

An object of the present invention is to provide a multi-chip stack package, which comprises a substrate, a first chip, a redistribution structure, at least one second chip, and a plurality of first bonding wires. The redistribution structure comprises a plurality of first intermediate pads, a plurality of second intermediate pads, and a plurality of external pads. The first intermediate pads, the second intermediate pads, and the external pads are formed on a first active surface of the first chip. The second chip is stacked on the redistribution structure, and electrically connected to the first intermediate pads. The first intermediate pads are connected to the second intermediate pads through a plurality of intermediate circuits or a plurality of intermediate bonding wires. The second intermediate pads are connected to the substrate through the first bonding wires, so that the second chip electrically conducts with the substrate, so as to reduce the connection length of the bonding wires, thus avoiding using the long bonding wires to connect the second chip and the substrate, and avoiding short circuits of the bonding wires caused by the pushing of the mold flow.

Another object of the present invention is to provide a multi-chip stack package, wherein a redistribution structure is formed on an active surface of a first chip, and at least one second chip is stacked on the redistribution structure. The redistribution structure includes a plurality of first intermediate pads, a plurality of second intermediate pads, and a plurality of external pads. The first intermediate pads, the second intermediate pads, and the external pads are formed on an active surface of the first chip. The second chip can be disposed at an appropriate position of the redistribution structure to form chip stacks of various sizes, without using long bonding wires, especially when the dimension of the second chip is smaller than that of the first chip by 25%.

The multi-chip stack package according to the present invention comprises a substrate, a first chip, a redistribution structure, at least one second chip, and a plurality of first bonding wires. The substrate comprises an upper surface and a plurality of connecting pads formed on the upper surface. The first chip is disposed on the upper surface of the substrate and has a first active surface and a plurality of first bonding pads formed on the first active surface. The first active surface faces upwards. The redistribution structure comprises a plurality of first intermediate pads, a plurality of second intermediate pads, and a plurality of external pads. The first intermediate pads, the second intermediate pads, and the external pads are formed on a first active surface of the first chip. The first intermediate pads electrically conduct with the second intermediate pads. The external pads are electrically connected to the first bonding pads of the first chip. The second chip is stacked on the redistribution structure, and has a second active surface and a plurality of bonding pads formed on the second active surface. The second bonding pads of the second chip are electrically connected to the first intermediate pads. The first bonding wires are used to connect the second intermediate pads of the redistribution structure and the connecting pads of the substrate. The external pads of the redistribution structure are connected to the connecting pads of the substrate through a plurality of second bonding wires.

DETAILED DESCRIPTION OF THE INVENTION

The present invention will be illustrated by the embodiments below, with reference to the accompanying drawings.

Figure 1:
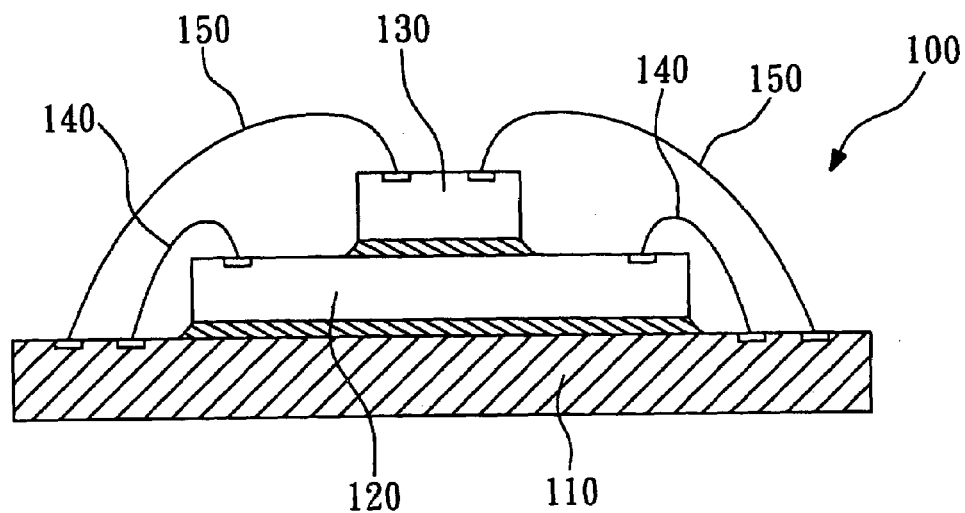
FIG. 1 is a schematic sectional view of a conventional multi-chip stack package.
Figure 2:
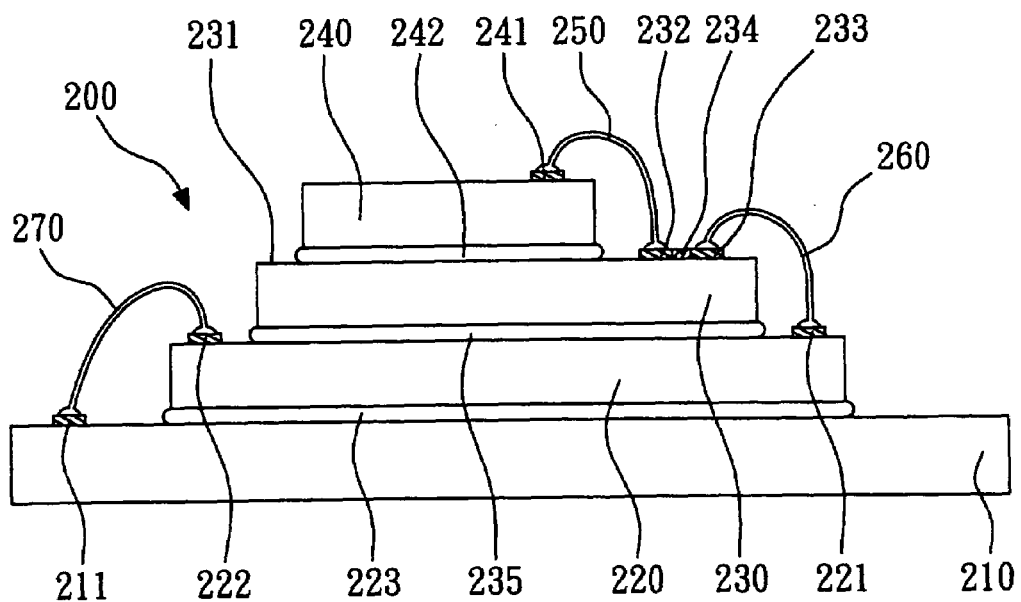
FIG. 2 is a schematic sectional view of a chip stack package structure in the US Pub. No. 2003/0153122.
Figure 3:
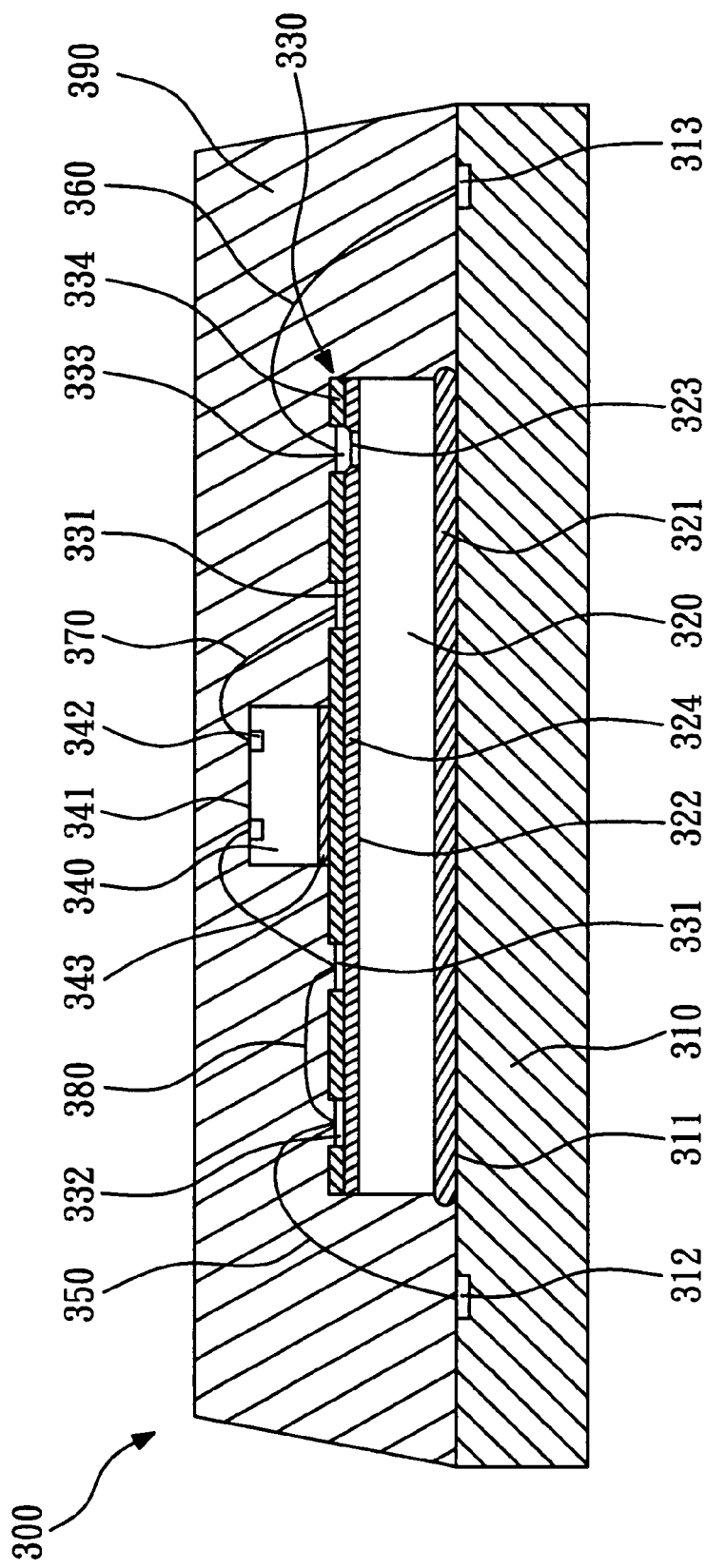
FIG. 3 is a schematic sectional view of a multi-chip stack package according to a first embodiment of the present invention.

Referring to FIG. 3, according to the first embodiment of the present invention, a multi-chip stack package 300 mainly comprises a substrate 310, a first chip 320, a redistribution structure 330, a second chip 340, and a plurality of first bonding wires 350. The substrate 310 comprises an upper surface 311 and a plurality of connecting pads 312, 313 formed on the upper surface 311. The substrate 310 can be a printed circuit board. The first chip 320 comprises a first active surface 322 and a plurality of bonding pads 323 formed on the first active surface 322, and it is stacked on the upper surface 311 of the substrate 310 through an adhesive 321, by the first active surface 322 facing upwards. In this embodiment, the first bonding pads 323 are arranged at the periphery of the first active surface 322. A passivation layer 324 is formed on the first active surface 322, and exposes the first bonding pads 323. The first chip 320 can be a memory chip.

The redistribution structure 330 comprises a plurality of first intermediate pads 331, a plurality of second intermediate pads 332, a plurality of external pads 333, and a protective layer 334. The first intermediate pads 331, the second intermediate pads 332, the external pads 333, and the protective layer 334 are formed on the passivation layer 324 of the first active surface 322. The protective layer 334 exposes the first intermediate pads 331, the second intermediate pads 332, and the external pads 333. Preferably, the second intermediate pads 332 and the external pads 333 are formed at the periphery of the first active surface 322 of the first chip 320. In this embodiment, the second intermediate pads 332 and the external pads 333 are arranged in a single row. The external pads 333 are electrically connected to the first bonding pads 323 of the first chip 320.

The second chip 340 comprises a second active surface 341 and a plurality of second bonding pads 342 formed on the second active surface 341. The second bonding pads 342 are electrically connected to the first intermediate pads 331 of the redistribution structure 330. In this embodiment, the second chip 340 is stacked on the protective layer 334 of the redistribution structure 330 through an adhesive 343, by the second active surface 341 facing upwards. A plurality of third bonding wires 370 are used to connect the second bonding pads 342 and the first intermediate pads 331. The dimension of the second chip 340 is smaller than that of the first chip 320 by 25%. Preferably, the second chip 340 is a controlling chip.

The second intermediate pads 332 of the redistribution structure 330 are connected to the connecting pads 312 of the substrate 310 through the first bonding wires 350. The external pads 333 of the redistribution structure 330 are connected to the connecting pads 313 of the substrate 310 through a plurality of second bonding wires 360. In this embodiment, a plurality of intermediate bonding wires 380 are used to connect the first intermediate pads 331 and the second intermediate pads 332. A molding compound 390 is used for sealing the first chip 320, the redistribution structure 330, the second chip 340, the first bonding wires 350, the second bonding wires 360, the third bonding wires 370, and the intermediate bonding wires 380, thus forming the multi-chip stack package 300.

In the above-mentioned multi-chip stack package 300, the second chip 340 is stacked on the redistribution structure 330, and connected to the first intermediate pads 331 through the third bonding wires 370. The intermediate bonding wires 380 are used to connect the first intermediate pads 331 and the second intermediate pads 332. Then the first bonding wires 350 are used to connect the second intermediate pads 332 and the connecting pads 312 of the substrate 310, to avoid using the long bonding wires to connect the second chip 340 and the substrate 310, thus reducing the short circuits caused by pushing of the mold flow.

Figure 4:
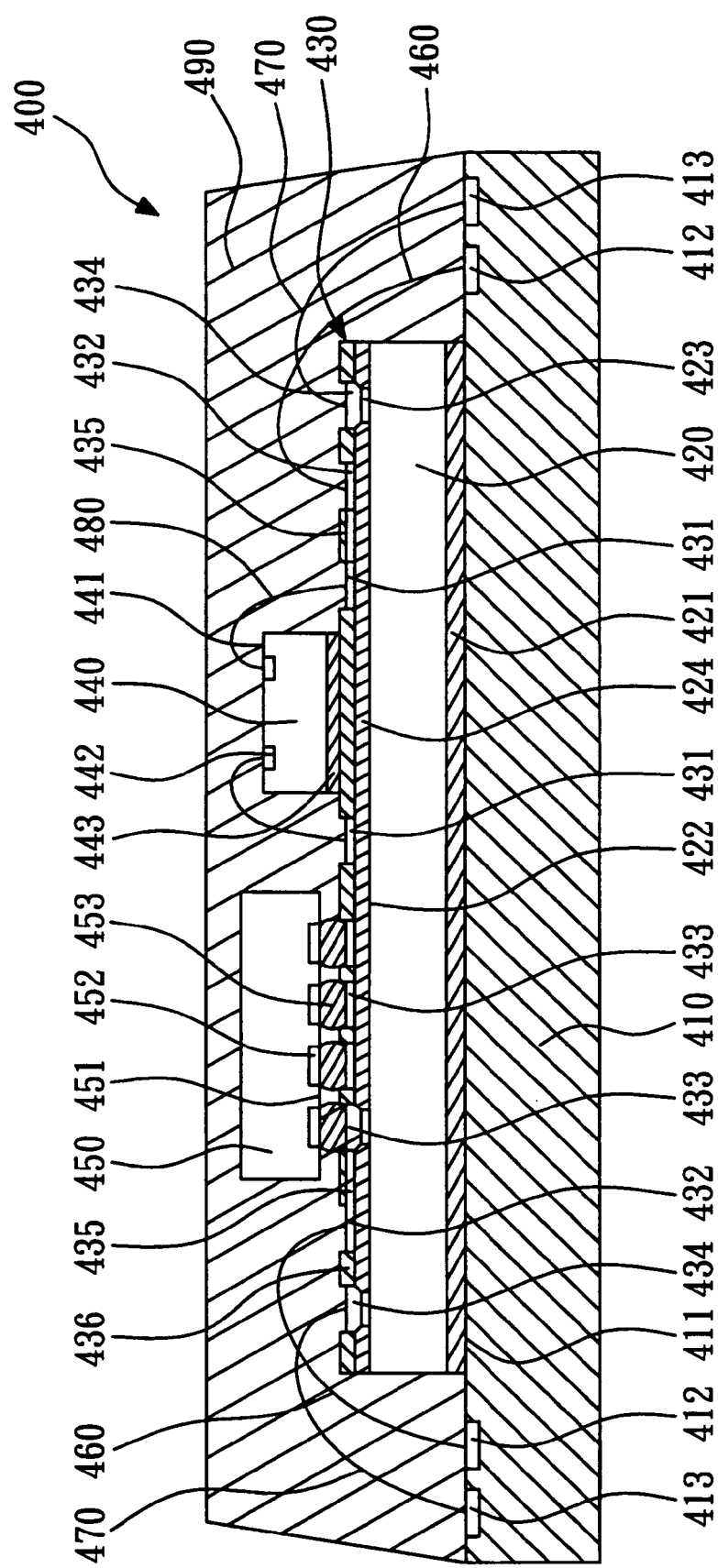

Referring to FIG. 4, according to the second embodiment of the present invention, a multi-chip stack package 400 mainly comprises a substrate 410, a first chip 420, a redistribution structure 430, a second chip 440, a third chip 450, and a plurality of first bonding wires 460. The substrate 410 comprises an upper surface 411 and a plurality of connecting pads 412, 413 formed on the upper surface 411.

The first chip 420 comprises a first active surface 422 and a plurality of first bonding pads 423 formed on the first active surface 422. The first chip 420 is attached to the upper surface 411 of the substrate 410 through an adhesive 421, by the first active surface 422 facing upwards. A passivation layer 424 is formed on the first active surface 422 and exposes the first bonding pads 423.

The redistribution structure 430 formed on the first active surface 422 of the first chip 420 comprises a plurality of first intermediate pads 431, a plurality of second intermediate pads 432, a plurality of third intermediate pads 433, a plurality of external pads 434, a plurality of intermediate circuits 435 and a protective layer 436. The protective layer 436 is used to cover the intermediate circuits 435 and exposes the first intermediate pads 431, the second intermediate pads 432, the third intermediate pads 433, and the external pads 434. In this embodiment, the second intermediate pads 432 and the external pads 434 are arranged in double rows. The external pads 434 are closer to the edge of the first active surface 422 of the first chip 420. The first intermediate pads 431 and the second intermediate pads 432 are connected through the intermediate circuits 435. The intermediate circuits 435 are used to connect the third intermediate pads 433 and the second intermediate pads 432. The external pads 434 are electrically connected to the first bonding pads 423 of the first chip 420.

The second chip 440 comprises a second active surface 441 and a plurality of second bonding pads 442 formed on the second active surface 441. In this embodiment, the second active surface 441 faces upwards, and the second chip 440 is attached to the redistribution structure 430 through an adhesive 443. A plurality of third bonding wires 480 are used to connect the second bonding pads 442 of the second chip 440 and the first intermediate pads 431 of the redistribution structure 430, wherein the dimension of the second chip 440 is smaller than that of the first chip 420 by 25%.

The third chip 450 comprises a third active surface 451 and a plurality of third bonding pads 452 arranged on the third active surface 451 in matrix. A plurality of bumps 453 are disposed on the third bonding pads 452. The third chip 450 is flip-chip bonded to the third intermediate pads 433 of the redistribution structure 430 through the bumps 453. Preferably, an under filling adhesive (not shown) is used for filling the gaps between the bumps 453. The dimension of the third chip 450 is less than that of the first chip 420 by 25%.

In this embodiment, the second intermediate pads 432 of the redistribution structure 430 are connected to the connecting pads 412 of the substrate 410 through the first bonding wires 460. The external pads 434 of the redistribution structure 430 are connected to the connecting pads 413 of the substrate 410 through the second bonding wires 470. The second bonding pads 442 of the second chip 440 are connected to the first intermediate pads 431 of the redistribution structure 430 through the third bonding wires 480, such that the second chip 440 and the third chip 450 are electrically connected to the substrate 410 through the redistribution structure 430 on the first chip 420. A molding compound 490 is used to seal the first chip 420, the redistribution structure 430, the second chip 440, the third chip 450, the first bonding wires 460, the second bonding wires 470, and the third bonding wires 480.

In the above-mentioned multi-chip stack package 400, the second chip 440 is connected to the first intermediate pads 431 of the redistribution structure 430 through the third bonding wires 480. The third chip 450 is bonded to the third intermediate pads 433 of the redistribution structure 430 through the bumps 453. The intermediate circuits 435 are used to connect the first intermediate pads 431 and the second intermediate pads 432, and the first bonding wires 460 are used to connect the second intermediate pads 432 and the connecting pads 412 of the substrate 410, so that the second chip 440 and the third chip 450 are electrically conducted with the substrate 410 to avoid using long bonding wires, and reducing short circuits caused by pushing of mold flow.

While several embodiments of the present invention have been illustrated and described, various modifications and improvements can be made by those skilled in the art. The embodiments of the present invention are therefore described in an illustrative but not restrictive sense. It is intended that the present invention may not be limited to the particular forms as illustrated, and that all modifications which maintain the spirit and scope of the present invention are within the scope as defined in the appended claims.

What is claimed is:

1. A multi-chip stack package, comprising:
   a substrate having an upper surface and a plurality of connecting pads formed on the upper surface;
   a first chip disposed on the upper surface of the substrate, and having a first active surface and a plurality of first bonding pads formed on the first active surface;
   a redistribution structure having a plurality of first intermediate pads, a plurality of second intermediate pads and a plurality of external pads, wherein the first intermediate pads, the second intermediate pads and the external pads are formed on the first active surface of the first chip, the first intermediate pads and the second intermediate pads are electrically connected to each other, and the external pads are electrically connected to the first bonding pads of the first chip;
   at least one second chip disposed on the redistribution structure and having a second active surface and a plurality of second bonding pads formed on the second active surface, the second bonding pads of the second chip electrically connected to the first intermediate pads;
   a plurality of first bonding wires for connecting the second intermediate pads of the redistribution structure and the connecting pads of the substrate; and
   a plurality of second bonding wires for connecting the external pads of the redistribution structure and the connecting pads of the substrate.

2. The multi-chip stack package according to claim 1, wherein the redistribution structure further comprises a plurality of intermediate circuits for connecting the first intermediate pads and the second intermediate pads.

3. The multi-chip stack package according to claim 2, wherein the redistribution structure further comprises a protective layer formed on the first active surface of the first chip, and the first intermediate pads, the second intermediate pads and the external pads are exposed.

4. The multi-chip stack package according to claim 3, wherein the protective layer covers the intermediate circuits.

5. The multi-chip stack package according to claim 1, further comprising a plurality of intermediate bonding wires for connecting the first intermediate pads and the second intermediate pads.

6. The multi-chip stack package according to claim 1, further comprising a plurality of third bonding wires for connecting the second bonding pads of the second chip and the first intermediate pads.

7. The multi-chip stack package according to claim 1, further comprising a plurality of bumps for connecting the second bonding pads of the second chip and the first intermediate pads.

8. The multi-chip stack package according to claim 1, wherein the second intermediate pads of the redistribution structure are formed at the periphery of the first active surface of the first chip.

9. The multi-chip stack package according to claim 1, wherein the external pads of the redistribution structure are formed at the periphery of the first active surface of the first chip.

10. The multi-chip stack package according to claim 1, wherein the second intermediate pads and the external pads are arranged at the periphery of the first active surface of the first chip in a single row.

11. The multi-chip stack package according to claim 1, wherein the second intermediate pads and the external pads are arranged at the periphery of the first active surface of the first chip in multiple rows.

* * * * *